United States Patent

Tahara

[11] Patent Number: 5,579,266
[45] Date of Patent: Nov. 26, 1996

[54] SEMICONDUCTOR MEMORY DEVICE

[75] Inventor: Yoshiaki Tahara, Hyogo, Japan

[73] Assignee: Mitsubishi Denki Kabushiki Kaisha, Tokyo, Japan

[21] Appl. No.: 460,943

[22] Filed: Jun. 5, 1995

[30] Foreign Application Priority Data

Sep. 6, 1994 [JP] Japan .................................. 6-212436

[51] Int. Cl.$^6$ .............................. G11C 7/00; G11C 29/00
[52] U.S. Cl. ...................... 365/200; 365/148; 365/225.7
[58] Field of Search ................................. 365/200, 225.7, 365/96, 100, 148, 226

[56] References Cited

U.S. PATENT DOCUMENTS

| | | | |
|---|---|---|---|
| 5,446,698 | 8/1995 | McClure | 365/200 X |
| 5,461,587 | 10/1995 | Oh | 365/200 |
| 5,471,426 | 11/1995 | McClure | 365/200 |

FOREIGN PATENT DOCUMENTS

| | | |
|---|---|---|
| 2-62800 | 3/1990 | Japan . |
| 2-177087 | 7/1990 | Japan . |

Primary Examiner—Do Hyun Yoo
Attorney, Agent, or Firm—Lowe, Price, LeBlanc & Becker

[57] ABSTRACT

Disclosed is a semiconductor memory device requiring smaller current consumption. A fuse circuit for programming substitution between a defective word line WL and a spare word line SWL at a power supply potential Vcc and a ground potential GND includes two fuses. Fuse is cut off when power supply potential Vcc is selected, while fuse is cut off when ground potential GND is selected. Accordingly, no current flows between power supply potential Vcc and ground potential GND.

5 Claims, 9 Drawing Sheets

SEMICONDUCTOR MEMORY DEVICE

BACKGROUND OF THE INVENTION

1. Field of the Invention

The present invention relates to semiconductor memory devices. More particularly, the invention relates to a semiconductor memory device including a redundancy circuit for carrying out substitution between defective memory cell rows or columns and redundancy memory cell rows or columns.

2. Description of the Background Art

Conventionally, semiconductor memory devices such as static random access memories (hereinafter referred to as "SRAMs") and dynamic random access memories (hereinafter referred to as "DRAMs") incorporate redundancy circuits in order to increase production yield of the semiconductor memory devices. If any defects occur in memories incorporated in the manufactured semiconductor memory devices, the defective memories are rescued by the function of the redundancy circuits. While this invention is generally applicable to such semiconductor memory devices as SRAMs and DRAMs, a description will be given on one example in which this invention is applied to an SRAM.

Figure 14:
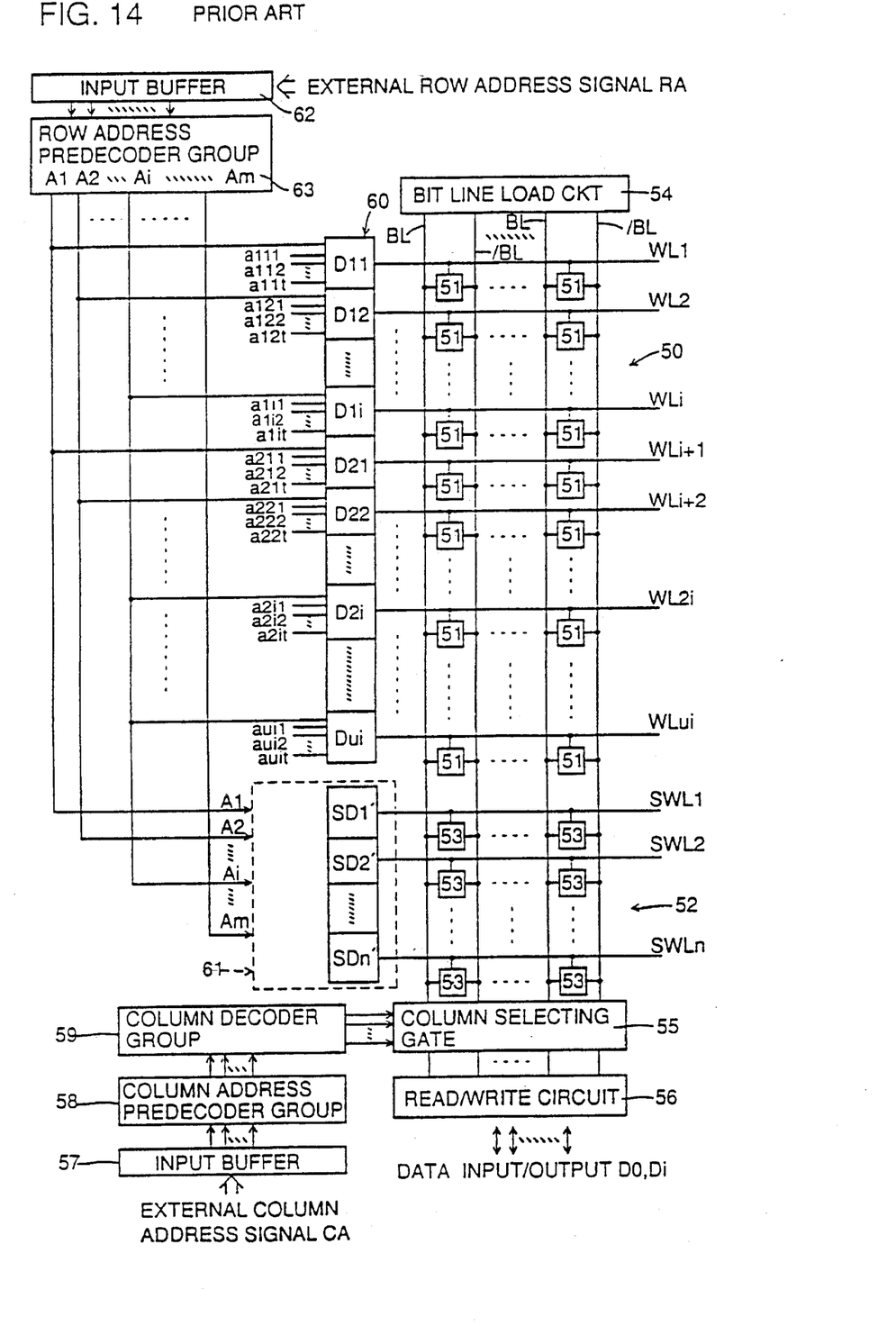
FIG. 14 is a partly omitted circuit block diagram showing a structure of a conventional SRAM.

FIG. 14 is a partly omitted circuit block diagram showing a configuration of a conventional SRAM. With reference to FIG. 14, this conventional SRAM includes a memory cell array 50 and a redundancy memory cell array 52. A plurality of bit line pairs BL and /BL are provided in common in memory cell array 50 and redundancy memory cell array 52. Memory cell array 50 includes a plurality (uxi) of word lines WL1–WLui intersecting bit line pairs BL and /BL, and memory cells 51 each provided at respective intersections of bit line pairs BL and /BL and word lines WL1–WLui. Word lines WL1–WLui are in groups of i. Redundancy memory cell array 52 includes a plurality (n) of spare word lines SWL1–SWLn intersecting bit line pairs BL and /BL, and redundancy memory cells 53 each provided at respective intersections of bit line pairs BL and /BL and spare word lines SWL1–SWLn.

The SRAM further includes a bit line load circuit 54 provided at one end of bit line pairs BL and /BL, a column selecting gate 55 and a read/write circuit 56 both provided at the other end of bit line pairs BL and /BL, and an input buffer 57, a column address predecoder group 58 and a column decoder group 59 for driving column selecting gate 55 in response to an external column address signal CA.

The SRAM further includes a row decoder group 60 provided at one end of word lines WL1–WLui, a redundancy row decoder group 61 provided at one end of spare word lines SWL1–SWLn, an input buffer 62 receiving an external row address signal RA, and a row address predecoder group 63 for converting the row address signal RA applied via input buffer 62 to predecode signals A1–Am to apply the signals A1–Am to row decoder group 60 and redundancy row decoder group 61. Row decoder group 60 includes a plurality (uxi) of row decoders D11–Dui each provided for their corresponding word lines WL1–WLui. Row decoders D11–Dui are set in groups of i in correspondence with word lines WL1–WLui.

Predecode signals A1–Am are divided into groups of t+1. For example, the first group includes i signals A1–Ai. Only one signal from each group is input to each of row decoders D11–Dui. For example, row decoder D11 receives a signal A1 of the first group, a signal a111 of the second group, a signal a112 of the third group, . . . and a signal a11t of the final group. When all signals A1, a111, a112, . . . and a11t attain a logic high level or an "H" level (selection level), row decoder D11 raises word line WL1 to a logic high level.

Redundancy row decoder group 61 includes a plurality (n) of redundancy row decoders SD1'–SDn' each provided for their corresponding spare word lines SWL1–SWLn.

Figure 15:
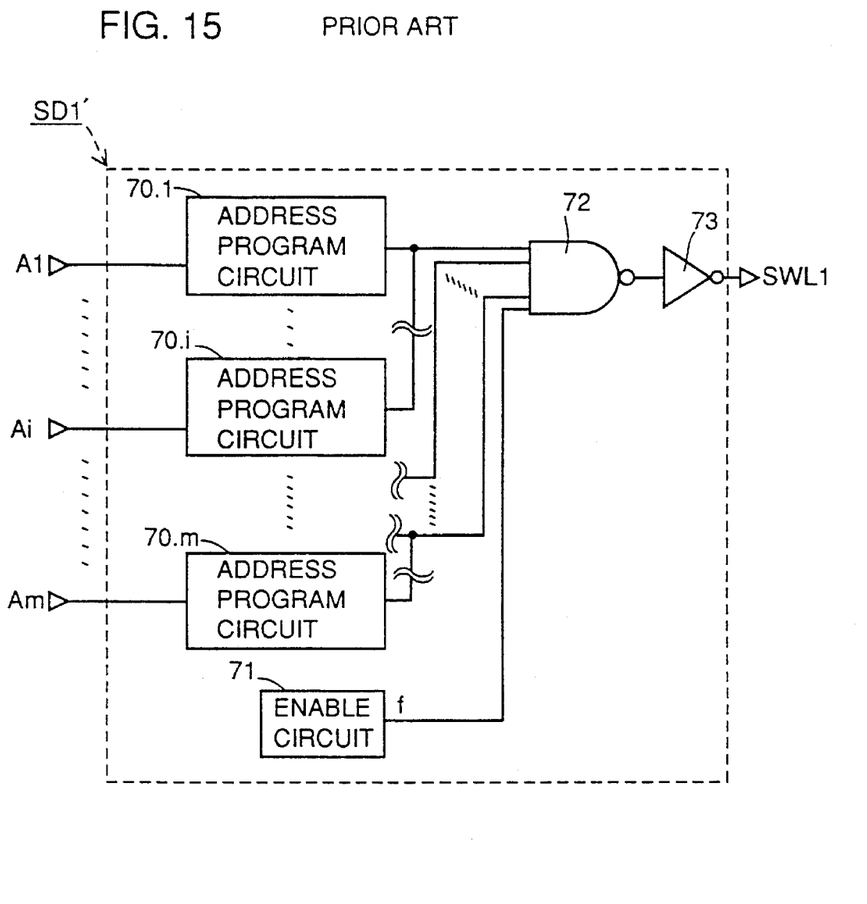
FIG. 15 is a partly omitted circuit block diagram showing a structure of a redundancy row decoder of the SRAM of FIG. 14.
Figure 16:
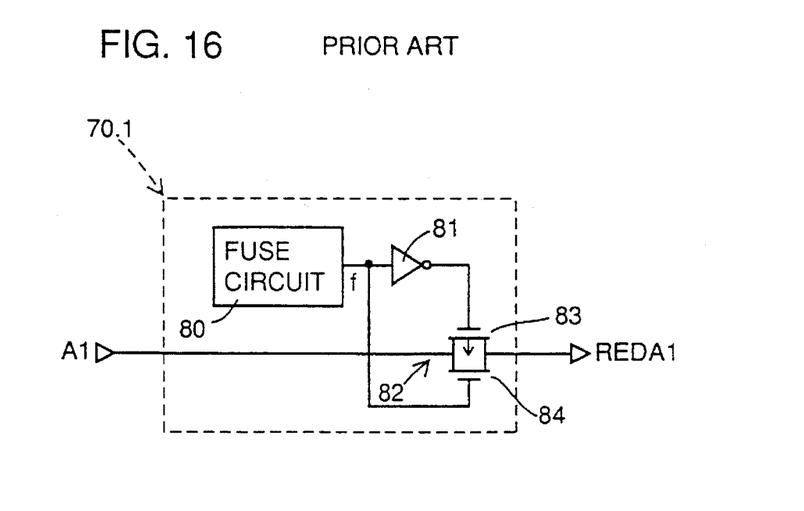
FIG. 16 is a circuit block diagram showing a structure of an address program circuit of the redundancy row decoder of FIG. 15.
Figure 17:
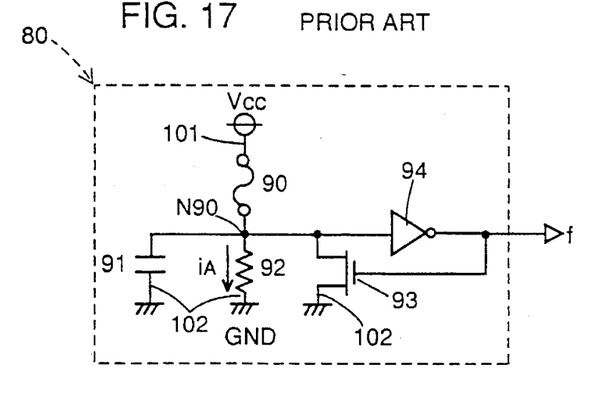
FIG. 17 is a circuit diagram showing a structure of a fuse circuit of the address program circuit of FIG. 16.

FIG. 15 is a circuit block diagram showing a configuration of redundancy row decoder SD1'. FIG. 16 is a circuit block diagram showing a configuration of an address program circuit 70.1 of FIG. 15. FIG. 17 is a circuit diagram showing a configuration of a fuse circuit 80 of FIG. 16. An enable circuit 71 of FIG. 15 is the same as fuse circuit 80 of FIG. 17.

With reference to FIG. 17, fuse circuit 80 includes a fuse 90 connected between a power source line 101 and a node N90, a capacitor 91, a high resistance element 92 and an N channel MOS transistor 93 connected in parallel between node N90 and a ground potential line 102, and an inverter 94 connected between node N90 and a gate of an N channel MOS transistor 93. An output of inverter 94 becomes an output f of fuse circuit 80.

If fuse 90 is not cut off, capacitor 91 is charged via fuse 90, and node N90 attains a logic high level (a power supply potential Vcc). Accordingly, inverter 94 outputs a logic low level (a ground potential GND). In response to this output, N channel MOS transistor 93 is rendered nonconductive, and node N90 is held at a logic high level.

Conversely, if fuse 90 is cut off, charges of capacitor 91 are discharged via high resistance element 92, and node N90 attains a logic low level. Accordingly, inverter 94 outputs a logic high level, so that N channel MOS transistor 93 is rendered conductive and node N90 is held at a logic low level.

Address program circuit 70.1 includes a fuse circuit 80, an inverter 81 and a transfer gate 82, as shown in FIG. 16. Transfer gate 82 includes a P channel MOS transistor 83 and an N channel MOS transistor 84 with their conduction electrodes connected to each other. An output f of fuse circuit 80 is input via inverter 81 to a gate of P channel MOS transistor 83 and also directly to a gate of N channel MOS transistor 84. A predecode signal A1 is input to one conduction electrode of transfer gate 82, and a signal output from the other conduction electrode of transfer gate 82 becomes an output signal REDA1 of address program circuit 70.1.

If fuse 90 is not cut off and output f of fuse circuit 80 is at a logic low level, transfer gate 82 is rendered nonconductive so as to prevent the input of predecode signal A1. In this case, output REDA1 of address program circuit 70.1 is put in a floating state.

Conversely, if fuse 90 is cut off and output f of fuse circuit 80 is at a logic high level, transfer gate 82 is rendered conductive so as to allow predecode signal A1 to pass through the transfer gate. In this case, output REDA1 of address program circuit 70.1 is set at the same level as that of predecode signal A1. The operations of other address program circuits 70.2–70.m are similar to the foregoing operation.

Redundancy row decoder SD1' includes address program circuits 70.1–70.m, enable circuit 71, an NAND gate 72 and an inverter 73, as shown in FIG. 15. Address program circuits 70.1–70.m receive predecode signals A1–Am, respectively. Address program circuits 70.1–70.m are divided into groups of t+1 in correspondence with predecode signals A1–Am. Respective output nodes of address program circuits 70.1–70.i; . . . of each group are connected in common. NAND gate 72 receives outputs of address program circuits 70.1–70.i; . . . in groups and an output f of enable circuit 71. An output node of NAND gate 72 is connected via inverter 73 to spare word line SWL1.

When all memory cells 51 of memory cell array 50 are normal and spare word line SWL1 is not used, fuse 90 is not cut off and outputs f of enable circuit 71 and fuse circuit 80 are held at a logic low level. Since output f of fuse circuit 80 is held at a logic low level, transfer gate 82 of each of address program circuits 70.1–70.m is rendered nonconductive, and outputs REDA1–REDAm of address program circuits 70.1–70.m are put in a floating state; however, since output f of enable circuit 71 is held at a logic low level, outputs of redundancy row decoders SD1'–SDm' are held at a logic low level. Accordingly, even if predecode signals A1–Am take any values, spare word line SWL1 is not selected.

On the other hand, in a case where word line WL1 is connected to some defective memory cell 51, and this word line WL1 is replaced by spare word line SWL1, for example, fuse 90 of fuse circuit 80 of each of address program circuits 70.1, . . . corresponding to predecode signals A1–Am designating the defective word line WL1 is cut off and fuse 90 of enable circuit 71 is also cut off. Both outputs f of enable circuit 71 and fuse circuit 80 whose fuses 90 are cut off attain a logic high level, so that transfer gates 82 of address program circuits 70.1, . . . are rendered conductive. Accordingly, if predecode signals A1–Am designating defective word line WL1 are output from row address predecoder group 63, outputs REDA1, . . . of all address program circuits 70.1, . . . having their fuses 90 cut off attain a logic high level, and an output of redundancy row decoder SD1' attains a logic high level. The other redundancy row decoders SD2'–SDn' carry out the same operation.

There also exists a fuse for inactivating row decoder D11 corresponding to defective word line WL1; however, a description will not be given on this fuse.

A description will now be given on the operation of the SRAM shown in FIGS. 14–17. A description will be given on a reading operation in a case where substitution between word line WL1 and spare word line SWL1 is programmed.

Bit line load circuit 54 precharges bit line pairs BL and /BL to a predetermined potential. Row address predecoder group 63 predecodes an external row address signal RA applied via input buffer 62 so as to output predecode signals A1–Am.

In a case where predecode signals A1–Am designate normal word lines WL2–WLui, row decoders D12–Dui corresponding to those predecode signals A1–Am allow those designated word lines WL2–WLui to attain a logic high level.

Conversely, in a case where predecode signals A1–Am designate some defective word line WL1, redundancy row decoder SD1' allows spare word line SWL1 to attain a logic high level in place of row decoder D11 which allows word line WL1 to attain a logic high level.

If word lines WL2–WLui or spare word line SWL1 is raised to a logic high level, any memory cells 51 or any redundancy memory cells 53 connected to those word lines WL2–WLui or that spare word line SWL1 are activated, so that data of the activated memory cells 51 or redundancy memory cells 53 appear as potential differences on bit line pairs BL and /BL. Input buffer 57, column address predecoder group 58 and column decoder group 59 respond to an external column address signal CA to drive column gate 55 and connect a bit line pair BL and /BL of a column corresponding to external column address signal CA and read/write circuit 56. Read/write circuit 56 amplifies the potential difference of the bit line pair BL and /BL to output the amplified potential difference as a data signal Do. For a writing operation, an opposite case to the above described reading operation may be considered.

Figure 18:
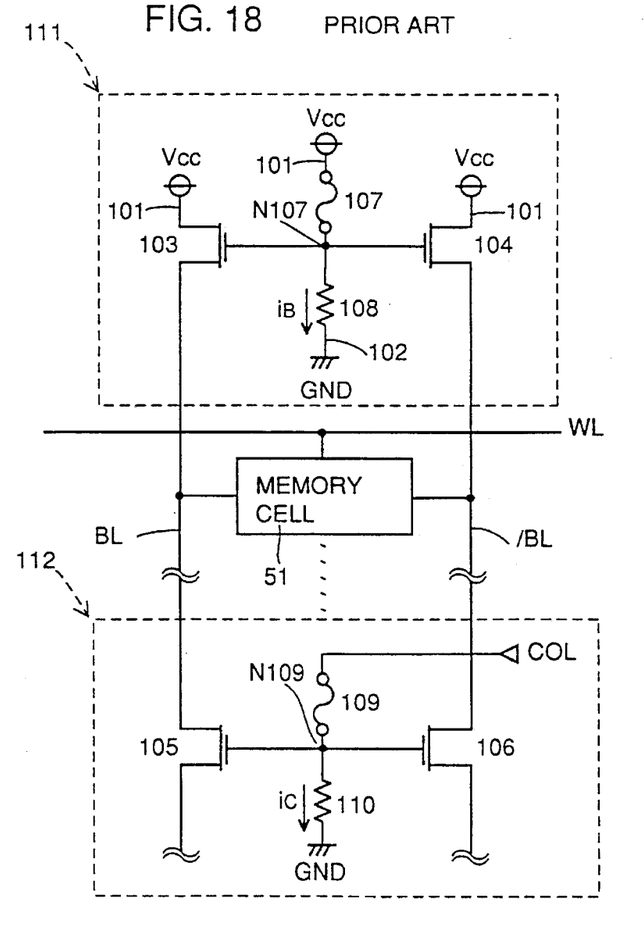
FIG. 18 is a partly omitted circuit block diagram showing a main part of another conventional SRAM.

FIG. 18 is a partly omitted circuit block diagram showing a major portion of another conventional SRAM. While the foregoing description has been made as to the SRAM including spare word lines SWL for use in substitution for defective word lines WL in FIGS. 14–17, a description will now be made on an SRAM including a spare bit line pair (not shown) for use in substitution for a defective bit line pair BL and /BL. Since an overall structure of the SRAM is similar to that of the SRAM shown in FIG. 14 except the fact that there is a replacement between rows and columns and between word lines and bit line pairs, no description will be made on the overall structure of the SRAM.

With reference to FIG. 18, this SRAM includes bit line pairs BL and /BL and word lines WL intersecting with each other, memory cells 51 each provided at intersections of bit line pairs BL and /BL and word lines WL, a bit line load circuit 111 provided at one end of bit line pairs BL and /BL, and a column selecting gate 112 provided at the other end of bit line pairs BL and /BL.

Bit line load circuit 111 includes N channel MOS transistors 103 and 104 each connected between one end of bit line pair BL and /BL and power supply potential lines 101, and a fuse 107 and a high resistance element 108 connected in series between power supply potential line 101 and a ground potential line 102. A connection node N107 between fuse 107 and high resistance element 108 is connected to respective gates of N channel MOS transistors 103 and 104.

Column selecting gate 112 includes N channel MOS transistors 105 and 106 each connected between the other end of bit line pair BL and /BL and a reading/writing circuit not shown, a fuse 109 having its one end supplied with a column selecting signal COL and the other end connected to a node N109, and a resistor 110 connected to node N109 and ground potential line 102. Node N109 is connected to respective gates of N channel MOS transistors 105 and 106.

When memory cell 51 connected to bit line pair BL and /BL is normal, neither fuse 107 nor 109 is cut off. Because of high resistance elements 108 and 110, node N107 is held at a logic high level, and node N109 attains the same level as that of a column selecting signal COL. Accordingly, N channel MOS transistors 103 and 104 are always rendered conductive, and bit line pair BL and /BL is precharged to a power supply potential Vcc via N channel MOS transistors 103 and 104. Further, if column selecting signal COL attains a logic high level, N channel MOS transistors 105 and 106 are rendered conductive. Conversely, if column selecting signal COL attains a logic low level, those transistors 105 and 106 are rendered nonconductive. Accordingly, bit line pair BL and /BL is connected to the reading/writing circuit not shown only when column selecting signal COL attains a logic high level.

On the other hand, if memory cell 51 connected to bit line pair BL and /BL is defective, fuses 105 and 107 are cut off and nodes N107 and N109 are held at a logic low level. Accordingly, N channel MOS transistors 103–106 are always rendered nonconductive and bit line pair BL and /BL is put in a floating state (a non-selection state).

The above described SRAM also includes a fuse circuit for use in applying a column selecting signal COL corresponding to a defective bit line pair BL and /BL to a column selecting gate corresponding to a spare bit line pair; however, a description will not be given on this fuse circuit.

However, the SRAM shown in FIGS. 14–17 has such a disadvantage that if fuse 90 is not cut off, a current $i_A$ (μA) flows from power supply potential line 101 via fuse 90 and high resistance element 92 to ground potential line 102, resulting in an increase in current consumption in proportion to the number of redundancy row decoders SD1'–SDm' or the number of predecode signals A1–Am.

Further, the SRAM shown in FIG. 18 has such a disadvantage that when neither fuse 107 nor 109 is cut off, currents $i_B$ and $i_C$ flow into high resistance elements 108 and 109, resulting in an increase in consumption current in proportion to the number of bit line pairs BL and /BL or the number of column selecting gates 112 connected to the same column selecting signal COL.

SUMMARY OF THE INVENTION

A main object of the present invention is to provide a semiconductor memory device requiring small current consumption.

Briefly, a program circuit includes a plurality of fuse pairs for selecting a first or a second potential, with one or the other fuse of each pair being cut off. Substitution between defective memory cell rows or columns and redundancy memory cell rows or columns is programmed depending on a combination of the selected first or second potential.

Therefore, according to the present invention, since one or the other fuse of each pair is inevitably cut off, no current flows between a first potential and a second potential through any fuse unlike the conventional case where a first or second potential is selected depending on whether a single fuse is cut off or not. This results in a decrease in current consumption.

Preferably, there is provided a first fuse for stopping a supply of a first or a second potential to a plurality of fuse pairs, with the first fuse being cut off when all memory cell rows or columns in a memory cell array are normal. Accordingly, when all of the memory cell rows or columns are normal, not a pair but only the first fuse must be cut off, resulting in simple programming.

Preferably, there is provided a pair of electrodes for supplying a first or a second potential to a plurality of fuse pairs, with the electrodes being bonded to each other when at least one defective memory cell row or column exists in a memory cell array. Accordingly, when all of the memory cell rows or columns in the memory cell array are normal, it is unnecessary to cut off any fuse or bond the pair of electrodes, resulting in simple and secure programming.

More preferably, a plurality of fuse pairs are divided into a plurality of groups corresponding to redundancy memory cell rows or columns. There is provided a second fuse for stopping a supply of a first or a second potential to all fuse pairs of a group corresponding to a redundancy memory cell row or column, with the second fuse being cut off when its corresponding redundancy memory cell row or column is not used. Accordingly, it is necessary to cut off only the fuse pairs for a redundancy memory cell row or column in use and the second fuse for the redundancy memory cell row or column not in use, resulting in simple programming.

Preferably, a redundancy circuit includes a gate circuit for selectively passing a row or column address signal for designating any defective memory cell row or column in accordance with a program of a program circuit, and a first selection circuit responsive to the row or column address signal which has passed the gate circuit for selecting a corresponding redundancy memory cell row or column. This leads to a simple configuration of the redundancy circuit.

Preferably, the redundancy circuit includes a second selection circuit for setting any defective memory cell row or column in a non-selection state in accordance with the program of the program circuit. This ensures substitution between any defective memory cell row or column and any redundancy memory cell row or column.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
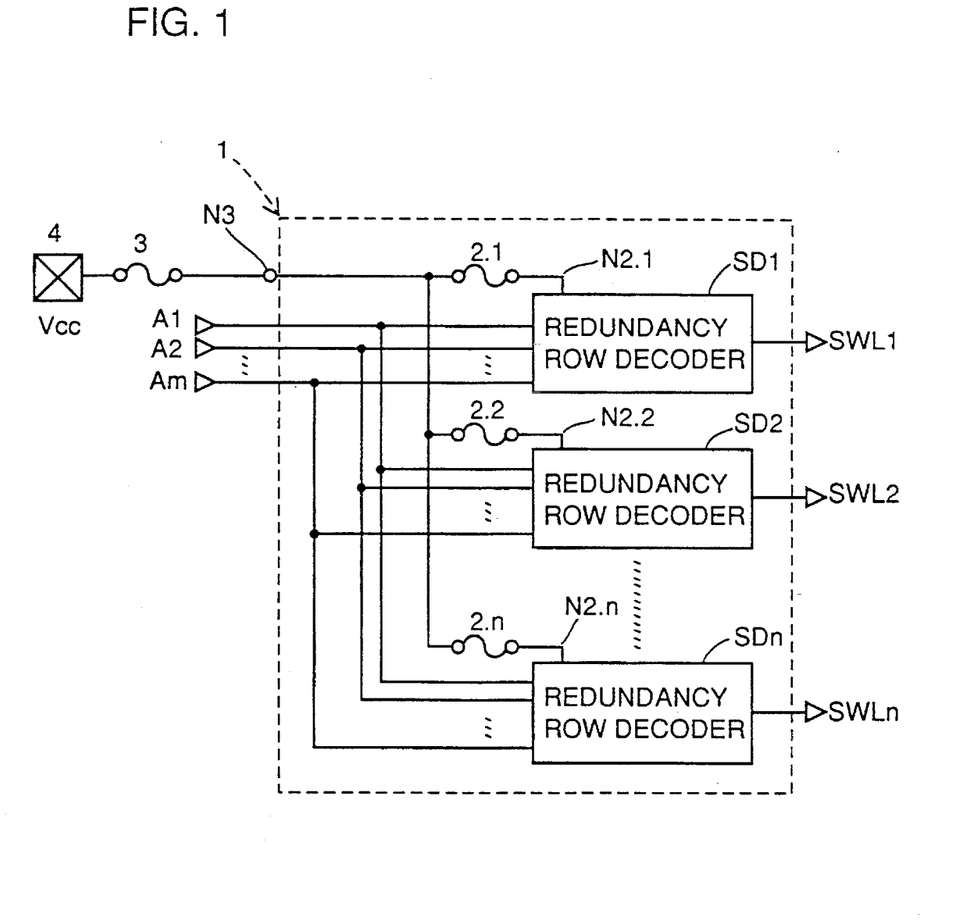
FIG. 1 is a partly omitted circuit block diagram showing a main part of an SRAM according to a first embodiment of the present invention.
Figure 2:
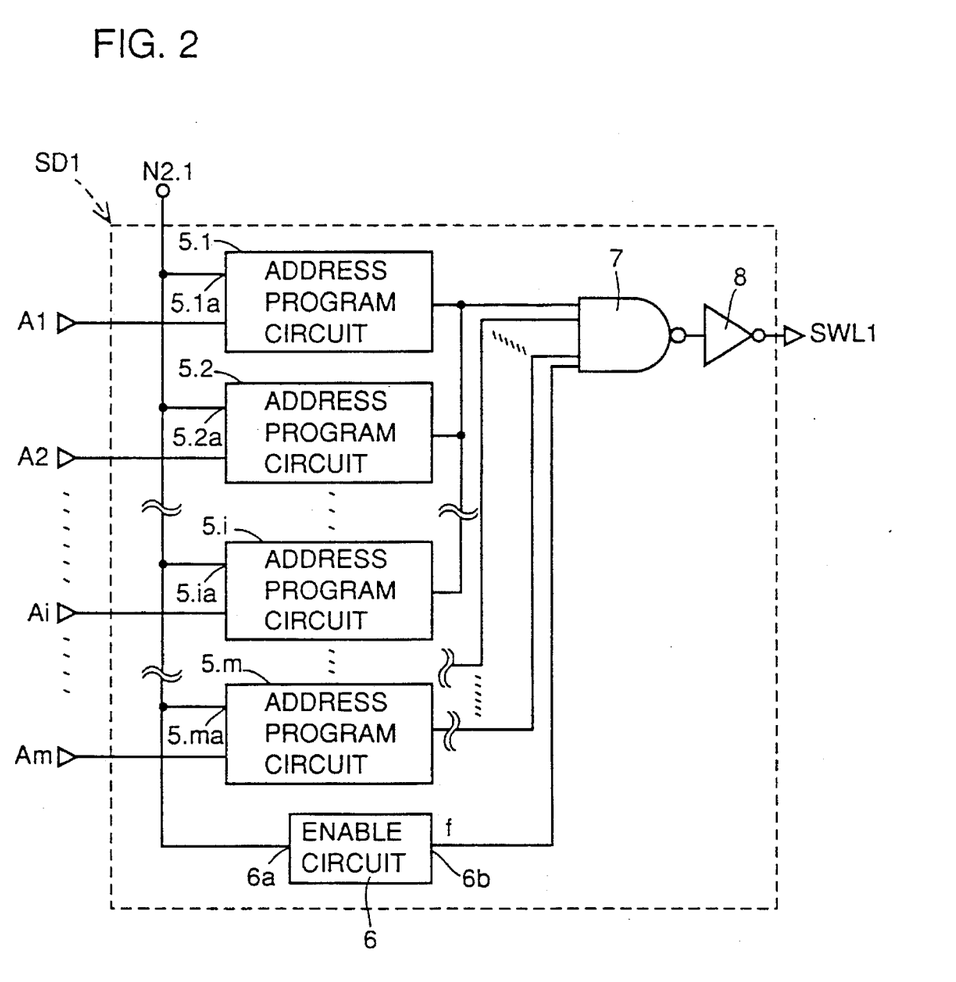
FIG. 2 is a partly omitted circuit block diagram showing a structure of a redundancy row decoder of the SRAM shown in FIG. 1.
Figure 3:
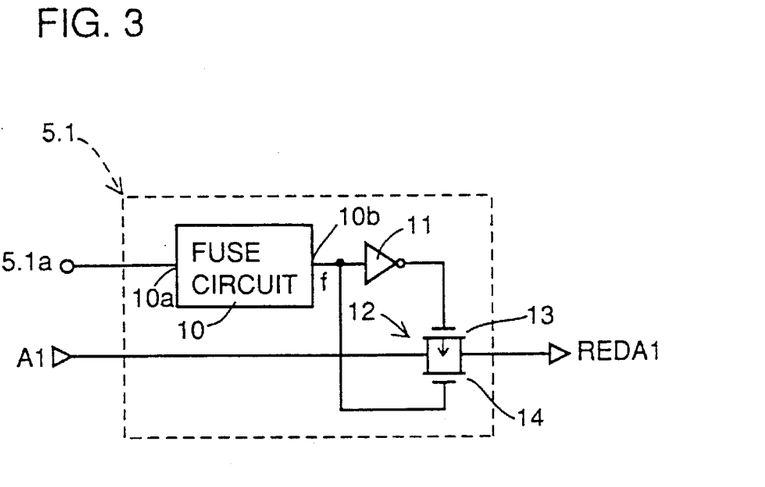
FIG. 3 is a circuit block diagram showing a structure of an address program circuit of the redundancy row decoder shown in FIG. 2.
Figure 4:
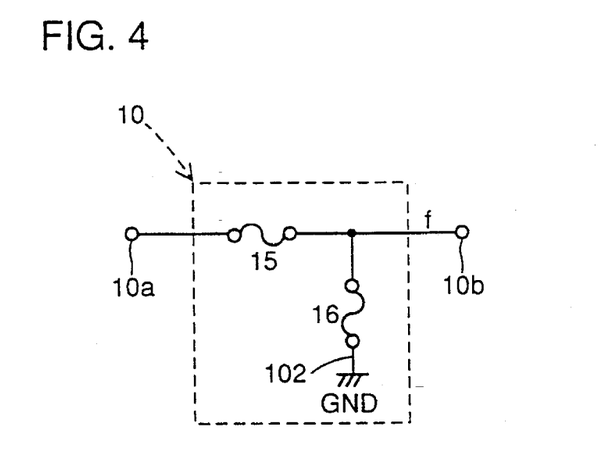
FIG. 4 is a circuit diagram showing a structure of a fuse circuit of the address program circuit shown in FIG. 3.

FIG. 1 is a partly omitted circuit block diagram showing a main part of an SRAM according to a first embodiment of the present invention; FIG. 2 is a partly omitted circuit block diagram showing a structure of a redundancy row decoder SD1 of FIG. 1; FIG. 3 is a circuit block diagram showing a structure of an address program circuit 5.1 of FIG. 2; and FIG. 4 is a circuit diagram showing a structure of a fuse circuit 10 of FIG. 3. An enable circuit 6 of FIG. 2 is identical to fuse circuit 10 of FIG. 4. Since an overall structure of the SRAM is identical to that of the SRAM shown in FIG. 14, a description thereof will not be repeated here.

With reference to FIG. 4, fuse circuit 10 includes a fuse 15 connected between an input node 10a and an output node 10b, and a fuse 16 connected between output node 10b and a ground potential line 102. A potential of output node 10b becomes an output f of fuse circuit 10.

If only one fuse 15 is cut off, output node 10b is grounded through fuse 16, and output f of fuse circuit 10 is held at a logic low level.

If only the other fuse 16 is cut off, output node 10b is connected to input node 10a through fuse 15. In this case, as will be described later, since a power supply potential Vcc is applied to input node 10a, output f of fuse circuit 10 is held at a logic high level.

If neither fuse 15 nor 16 is cut off, input node 10a is put in a floating state, so that output f of fuse circuit 9 is held at a logic low level, as will be described later. There is no case where both fuses 15 and 16 are cut off.

With reference to FIG. 3, address program circuit 5.1 includes fuse circuit 10, an inverter 11 and a transfer gate 12. Transfer gate 12 includes a P channel MOS transistor 13 and an N channel MOS transistor 14, conduction electrodes of which are connected to each other. Input node 10a of fuse circuit 10 becomes a power source input node 5.1a of address program circuit 5.1. Output f of fuse circuit 10 is applied via inverter 11 to a gate of P channel MOS transistor 13 and also directly to a gate of N channel MOS transistor 14. One conduction electrode of transfer gate 12 is supplied with a predecode signal A1, and a signal appearing on the other conduction electrode of transfer gate 12 becomes an output signal REDA1 of address program circuit 5.1.

If only the one fuse 15 is cut off, or if neither fuse 15 nor 16 is cut off and output f of fuse circuit 10 is at a logic low level, then transfer gate 12 is rendered nonconductive so as to prevent an input of predecode signal A1. Accordingly, output REDA1 of address program circuit 5.1 is put in a floating state.

If only the other fuse 16 is cut off and output f of fuse circuit 10 is at a logic high level, then transfer gate 12 is rendered conductive so as to allow predecode signal A1 passing therethrough. Accordingly, output REDA1 of address program circuit 5.1 attains the same level as that of predecode signal A1. The same operation is carried out in other address program circuits 5.2–5.m.

As shown in FIG. 2, redundancy row decoder SD1 includes address program circuits 5.1–5.m, enable circuit 6, an NAND gate 7 and an inverter 8. Address program circuits 5.1–5.m receive predecode signals A1–Am, respectively. Power source input nodes 5.1a–5.ma of address program circuits 5.1–5.m are connected in common and are connected to a power source input node N2.1 of redundancy row decoder SD1. Address program circuits 5.1–5.m are divided into t+1 groups in correspondence with predecode signals A1–Am, and output nodes of address program circuits 5.1–5.i; ... of each group are connected in common. NAND gate 7 receives outputs of address program circuits 5.1–5.i; ... in group and an output f of enable circuit 6. An output node of NAND gate 7 is connected via inverter 8 to a spare word line SWL1.

If all memory cells 51 of memory cell array 50 are normal and spare word line SWL1 is not in use, then power source input node N2.1 is put in a floating state, neither fuse 15 nor 16 is cut off, and outputs f of enable circuit 6 and fuse circuit 10 are held at a logic low level. Since output f of fuse circuit 10 is held at a logic low level, transfer gates 12 of address program circuits 5.1–5.m are rendered nonconductive, and outputs REDA1–REDAm of address program circuits 5.1–5.m are put in a floating state; however, since output f of enable circuit 6 is held at a logic low level, an output of redundancy row decoder SD1 is held at a logic low level. Accordingly, none of spare word lines SWL1–SWLn are selected independently of the values of predecode signals A1–Am.

In a case where word line WL1 is, for example, connected to a defective memory cell 51, and this word line WL1 is replaced by spare word line SWL1, power source input node N2.1 is supplied with a power supply potential Vcc, and fuses 16 of fuse circuits 10 incorporated in address program circuits 5.1, ... corresponding to predecode signals A1–Am designating that defective word line WL1 and fuse 16 of enable circuit 6 are cut off. Outputs f of enable circuit 6 and fuse circuit 10 having their fuses 16 cut off attain a logic high level, so that transfer gates 12 of address program circuits 5.1, ... are rendered conductive. Accordingly, if predecode signals A1–Am designating defective word line WL1 are output from row address predecoder group 63, then outputs REDA1, ... of all address program circuits 5.1, ... having their fuses 16 cut off attain a logic high level, and the output of redundancy row decoder SD1 attains a logic high level. The same operation is carried out in other redundancy row decoders SD2–SDn.

Redundancy row decoder group 1 includes redundancy row decoders SD1–SDn and fuses 2.1–2.n, as shown in FIG. 1. Each of fuses 2.1–2.n has its one end connected to its corresponding one of power source input nodes N2.1–N2.n of redundancy row decoders SD1–SDn. The respective other ends of fuses 2.1–2.n are connected in common and also to a power source input node N3 of redundancy row decoder group 1.

This SRAM includes a fuse 3 and a bonding pad 4. Fuse 3 is connected between bonding pad 4 and power source input node N3 of redundancy row decoder group 1. Bonding pad 4 is bonded to a power source pin (not shown) which is externally supplied with a power supply potential Vcc.

In a case where all memory cells 51 of memory cell array 50 are normal and none of spare word lines SWL1–SWLn are used, fuse 3 is cut off and power source input node N3 of redundancy row decoder group 1 is put in a floating state. Accordingly, power source input nodes N2.1–N2.n of all redundancy row decoders SD1–SDn are put into a floating state, and outputs of redundancy row decoders SD1–SDn are held at a logic low level. In this case, none of fuses 2.1–2.n, 15 and 16 but fuse 3 are cut off.

In the case where word line WL1 is, for example, connected to a defective memory cell 51, and this word line WL1 is replaced by spare word line SWL1, fuses 2.2–2.n are cut off, power source input nodes N2.2–N2.n of redundancy row decoders SD2–SDn are brought into a floating state, and redundancy row decoders SD2–SDn are inactivated.

Further, as has been described above, in redundancy row decoder SD1, fuses 16 of fuse circuits 10 incorporated in address program circuits 5.1, . . . corresponding to predecode signals A1–Am designating defective word line WL1, and fuse 16 of enable circuit 6 are cut off. Therefore, if predecode signals A1–Am designating defective word line WL1 are output from row address predecoder group 63, then spare word line SWL1 is raised to a logic high level by redundancy row decoder SD1. In this case, none of fuses 3, 2.1, and 16 but fuses 2.2–2.n and a corresponding fuse 16 of redundancy row decoder SD1 are cut off. Since an overall operation of the SRAM is identical to that of the SRAM shown in FIGS. 14–17, a description thereof will not be repeated here.

In this embodiment, a plurality of fuses 3, 2.1–2.n, 15 and 16 are connected between bonding pad 4 supplied with a power supply potential Vcc and ground potential line 102, and at least one of fuses 3, 2.1–2.n, 15 and 16 must be cut off independently of use of spare word lines SWL1–SWLn. Accordingly, no current flows between a power supply potential Vcc and a ground potential GND through fuses 3, 2.1–2.n, 15 and 16. Therefore, when any spare word lines SWL1–SWLn are not in use, it is possible to make current consumption smaller than that in the conventional SRAM in which a current $i_A$ flows from a power supply potential Vcc to a ground potential GND through fuse 90.

Moreover, since fuses 2.1–2.n and 3 which are cut off to stop the supply of power supply potential Vcc to redundancy row decoders SD1–SDn are provided in the case where any spare word lines SWL1–SWLn are not in use, simple and fast programming is achieved.

Further, since fuse circuit 10 includes only two fuses 15 and 16, a layout area of the fuse circuit can be made smaller than the conventional case where fuse circuit 80 includes fuse 90, capacitor 91, high resistance element 92, N channel MOS transistor 93 and inverter 94.

Figure 5:
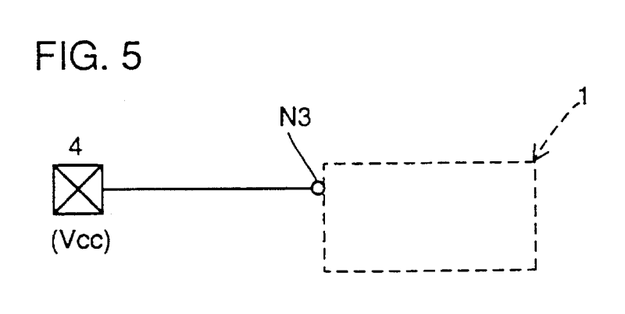
FIG. 5 is a circuit block diagram showing one example of improvements of the SRAM shown in FIG. 1.

As shown in FIG. 5, fuse 3 of FIG. 1 may be removed, and bonding pad 4 does not have to be bonded to a power source pin in the case where no defective memory cell 51 exists in memory cell array 50 and no spare word lines SWL1–SWLn are in use.

In accordance with the above described improvement, if there is no defective memory cell 51 in memory cell array 50, it is unnecessary to cut off any fuses or bond bonding pad 4. Therefore, a decrease in production yield due to a cut-off failure of fuse 3 does not occur in the SRAM shown in FIG. 1.

In the above described improvement, however, it is necessary to sort SRAMs which do not need bonding and those which bonding before bonding of bonding pad 4. In the SRAM of FIG. 1, since all bonding pads 4 of all the SRAMs are bonded, it has an advantage that sorting is unnecessary.

Embodiment 2

Figure 6:
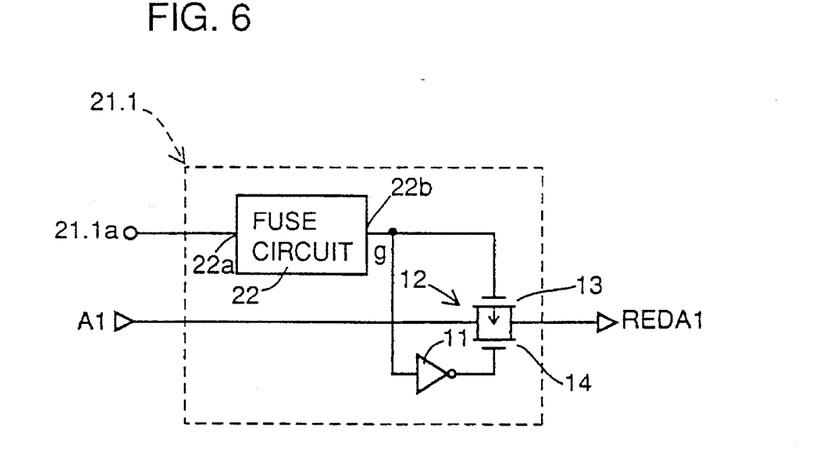
FIG. 6 is a circuit block diagram showing a structure of an address program circuit of a redundancy row decoder of an SRAM according to a second embodiment of the present invention.
Figure 7:
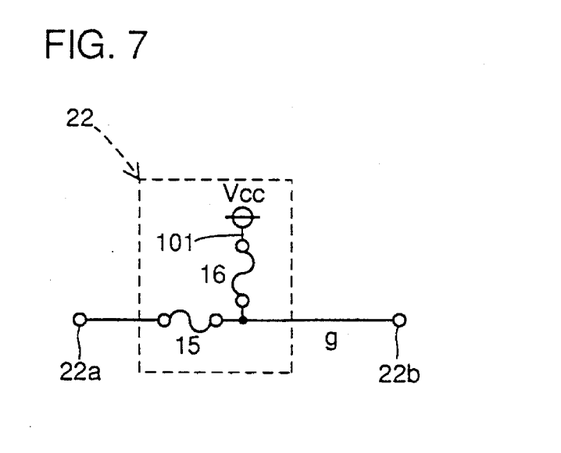
FIG. 7 is a circuit diagram showing a structure of a fuse circuit of the address program circuit shown in FIG. 6.
Figure 8:
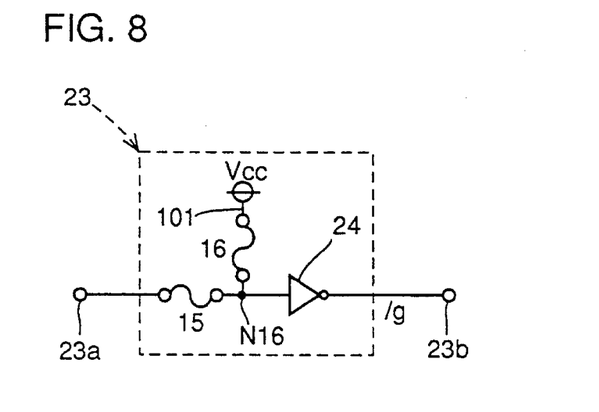
FIG. 8 is a circuit diagram showing a structure of an enable circuit of the SRAM shown in FIG. 6.

FIG. 6 is a circuit block diagram showing a structure of an address program circuit 21.1 of an SRAM according to a second embodiment of the present invention; FIG. 7 is a circuit diagram showing a structure of a fuse circuit 22 of FIG. 6; and FIG. 8 is a circuit diagram showing a structure of an enable circuit 23. Address program circuit 21.1 corresponds to address program circuit 5.1 of FIGS. 2 and 3; fuse circuit 22 corresponds to fuse circuit 10 of FIGS. 3 and 4; and enable circuit 23 corresponds to enable circuit 6 of FIG. 2.

This SRAM is different from the SRAM of the first embodiment in that a power supply potential Vcc and a ground potential GND are inverted. That is, a bonding pad 4 is bonded to a ground pin (not shown) supplied with ground potential GND, and respective fuses 16 of fuse circuit 22 and enable circuit 23 are connected to a power supply potential line 101.

As a result, since fuse circuit 22 outputs an opposite potential to that of fuse circuit 10 of FIGS. 2 and 4, an output g of fuse circuit 22 is applied via an inverter 11 to an N channel MOS transistor 14 and also directly to a gate of an N channel MOS transistor 13, in address program circuit 21.1. In enable circuit 23, an inverter 24 is provided between a connection node N16 of fuses 15 and 16 and an output node N23b, and an output /g of enable circuit 23 is an inversion of output g of fuse circuit 22. Since other structures and a cutting method of fuses 3, 2.1–2.n, 15 and 16 are the same as those of the SRAM of the first embodiment, a description thereof will not be repeated here.

This embodiment also achieves the same effect as that of the first embodiment.

Embodiment 3

Figure 9:
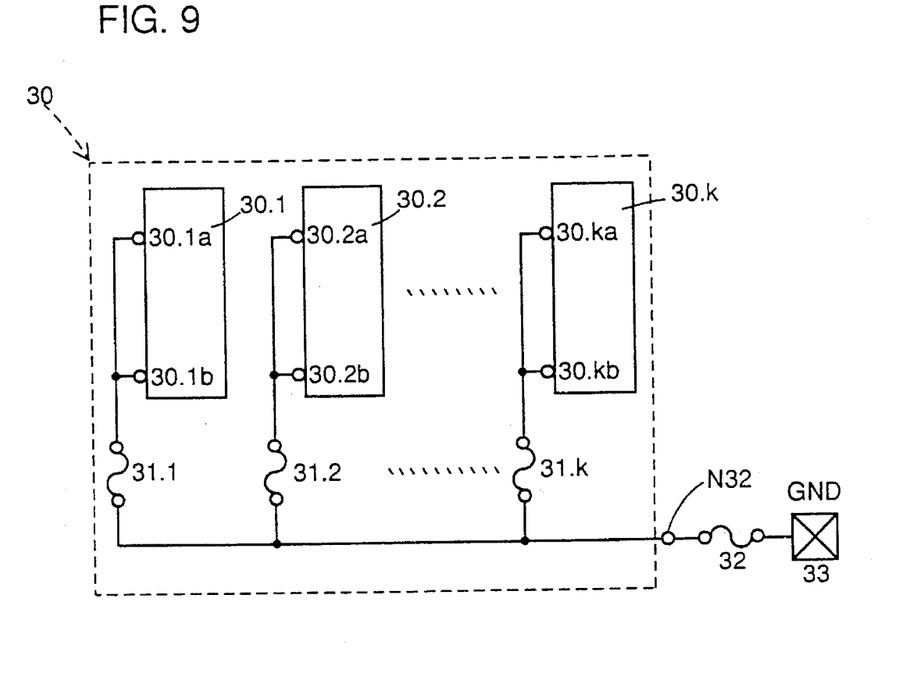
FIG. 9 is a partly omitted circuit block diagram showing a main part of an SRAM according to a third embodiment of the present invention.
Figure 10:
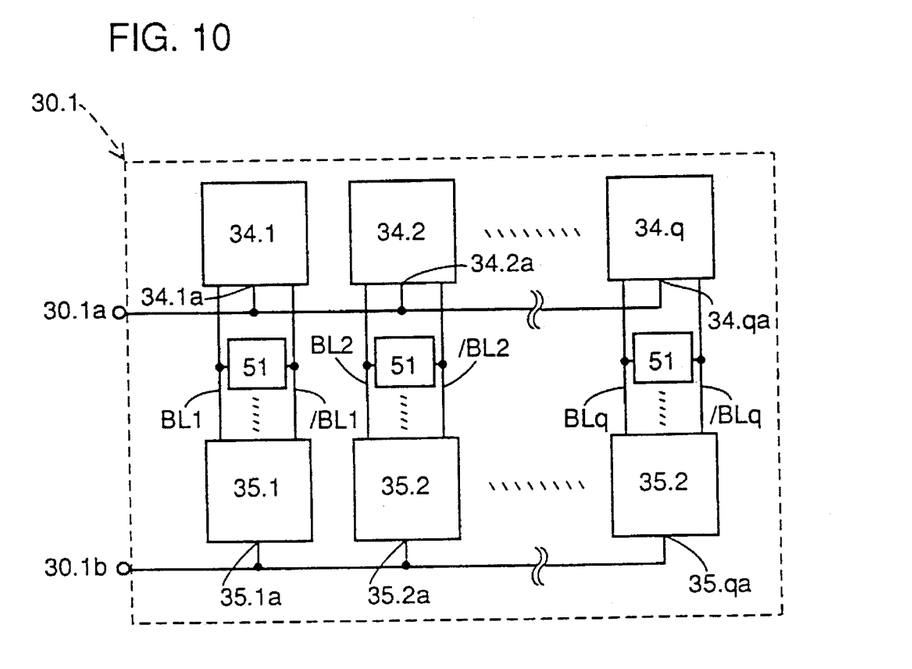
FIG. 10 is a partly omitted circuit block diagram showing a configuration of a memory cell block of the SRAM shown in FIG. 9.
Figure 11:
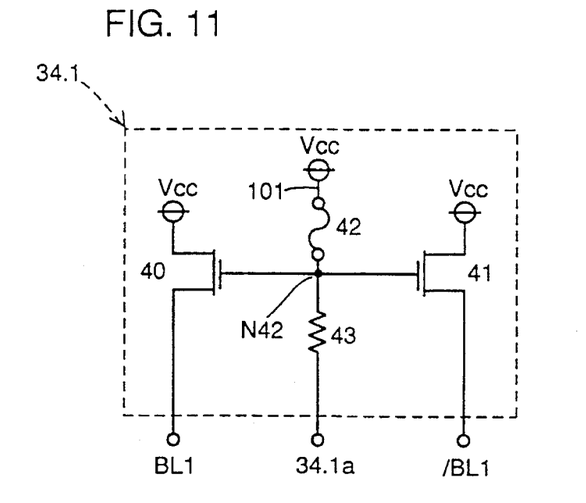
FIG. 11 is a circuit diagram showing a structure of a bit line load circuit of the memory cell block of FIG. 10.
Figure 12:
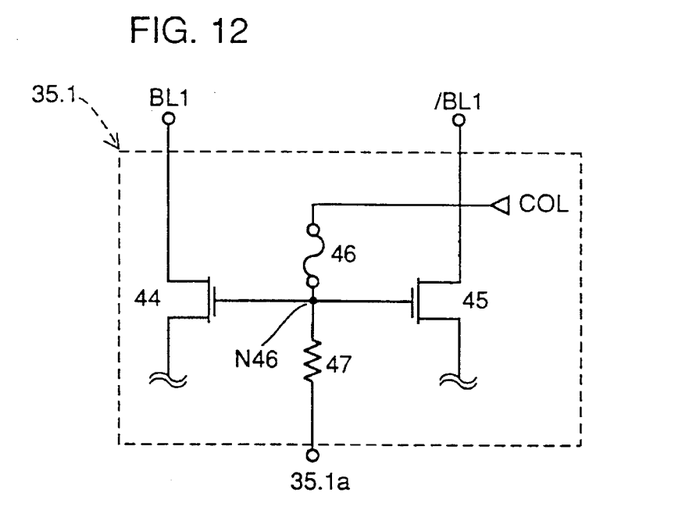
FIG. 12 is a circuit diagram showing a structure of a column selecting gate of the memory cell block of FIG. 10.

FIG. 9 is a partly omitted circuit block diagram showing a structure of a main part of an SRAM according to a third embodiment of the present invention; FIG. 10 is a circuit block diagram showing a structure of a memory cell block 30.1 of FIG. 9; FIG. 11 is a circuit diagram showing a structure of a bit line load circuit 34.1 of FIG. 10; and FIG. 12 is a circuit diagram showing a structure of a column selecting gate 35.1 of FIG. 10. Bit line load circuit 34.1 and column selecting gate 35.1 corresponds to bit line load circuit 111 and column selecting gate 112 of FIG. 18.

With reference to FIG. 9, this SRAM includes a memory cell array 30, a fuse 32 and a bonding pad 33. Memory cell array 30 includes a plurality (k) of memory cell blocks 30.1–30.k and a plurality (k) of fuses 31.1–31.k.

Respective memory cell blocks 30.1–30.k have their respective ground nodes 30.1a, 30.1b; 30.2a, 30.2b; . . . 30.ka, 30.kb connected to a ground node N32 of memory cell array 30 through respective fuses 31.1–31.k. Ground node N32 of memory cell array 30 is connected through fuse 32 to bonding pad 33 which is bonded to a ground pin (not shown) supplied with a ground potential GND.

As shown in FIG. 10, memory cell block 30.1 includes a plurality (q) of bit line pairs BL1, /BL1; BL2, /BL2,; . . . ; BLq, /BLq each connected to a plurality of memory cells 51, bit line load circuits 34.1–34.q provided, respectively, at one end of each of bit line pairs BL1, /BL1; BL2, /BL2; . . . ; BLq, /BLq, and column selecting gates 35.1–35.q provided, respectively, at the other end of each of bit line pairs BL1, /BL1; BL2, /BL2; . . . ; BLq, /BLq. Respective ground nodes 34.1a–34.qa of bit line peripheral circuits 34.1–34.q are connected in common and connected to a ground node 30.1a of memory cell block 30.1. Respective ground nodes 35.1a–35.qa of column selecting gates 35.1–35.q are connected in common and connected to a ground node 30.1b of memory cell block 30.1. The same structure is applied to other memory cell blocks 30.2–30.k.

With reference to FIG. 11, bit line load circuit 34.1 includes N channel MOS transistors 40 and 41 connected between one end of bit line BL1 and a power supply potential line 101 and between one end of bit line /BL1 and power supply potential line 101, respectively, and a fuse 42 and a high resistance element 43 connected in series between power supply potential line 101 and ground node 34.1a. A connection node N42 of fuse 42 and high resistance element 43 is connected to respective gates of N channel MOS transistors 40 and 41.

With reference to FIG. 12, column selecting gate 35.1 includes N channel MOS transistors 44 and 45 connected between the other end of bit line BL1 and a reading/writing circuit not shown and between the other end of bit line /BL1 and the reading/writing circuit, respectively, a fuse 46 having its one end supplied with a column selecting signal COL and the other end connected to a node N46, and a high resistance element 47 connected between node N46 and a ground node 35.1a. Node N46 is connected to respective gates of N channel MOS transistors 44 and 45.

With reference to FIGS. 11 and 12, if memory cells 51 connected to bit line pair BL1, /BL1 are normal, neither fuse 42 nor 46 is cut off. At this time, ground nodes 34.1a and 35.1a are grounded or put in a floating state, as will be described later. In both cases, node N42 is held at a logic high level, while node N40 attains the same level as that of column selecting signal COL because of high resistance elements 43 and 47. Thus, N channel MOS transistors 40 and 41 are always rendered conductive, and bit line pair BL1, /BL1 is precharged to a power supply potential Vcc via N channel MOS transistors 40 and 41. N channel MOS transistors 44 and 45 are rendered conductive in response to column selecting signal COL attaining a logic high level, while those transistors 44 and 45 are rendered nonconductive in response to column selecting signal COL attaining a logic low level. Accordingly, bit line pair BL1, /BL1 is connected to a reading/writing circuit not shown only when column selecting signal COL attains a logic high level.

On the other hand, if memory cells 51 connected to bit line pair BL1, /BL1 are defective, fuses 42 and 46 are cut off. At this time, since ground nodes 34.1a and 35.1a are grounded, nodes N42 and N46 are held at a logic low level, as will be described later. Thus, N channel MOS transistors 40, 41, 44 and 45 are always rendered nonconductive, and bit line pair BL1, /BL1 is brought into a floating state (a non-selection state). The same process is applied to other bit line pairs BL2, /BL2; . . . ; BLq, /BLq.

A description will now be given on the operation of the SRAM shown in FIGS. 9–12.

If all memory cells 51 of memory cell array 30 are normal and it is unnecessary to set bit line pair BL, /BL in a non-selection state, then only fuse 32 is cut off, and bit line peripheral circuits 34.1–34.q of all the bit line pairs BL, /BL and ground nodes 34.1a–34.qa and 35.1a–35.qa of column selecting gates 35.1–35.q are brought into a floating state. Accordingly, all the bit line pairs BL, /BL are put in a selection state by their corresponding column selecting signals COL.

On the other hand, if memory cells 51 connected to bit line pair BL1, /BL1 of memory cell block 30.1 are defective, for example, then only fuses 42 and 46 of bit line peripheral circuit 34.1 and column selecting gate 35.1 of defective bit line pair BL1, /BL1, and only fuses 31.2–30.k for other memory cell blocks 30.2–30. are cut off.

Accordingly, defective bit line pair BL1, /BL1 is set in a non-selection state. Further, the ground nodes of the column selecting gates and the bit line peripheral circuits of all bit line pairs BL, /BL of memory cell blocks 30.2–30.k are brought into a floating state, and all bit line pairs BL, /BL of memory cell block 30.2–30.k are put in a selection state by their corresponding column selecting signals COL. Further, ground nodes 34.2a–34.qa of bit line load circuits 34.2–34.q and ground nodes 35.2a–35qa of column selecting gates 35.2–35.q for normal bit line pairs BL2, /BL2; . . . ; BLq, /BLq of memory cell block 30.1, are grounded, and bit line pairs BL2, /BL2–BLq, /BLq are brought into a selection state by their corresponding column selecting signals COL.

In this embodiment structured as above, if there is no defective memory cell 51 in memory cell array 30, it is possible to completely separate a power supply potential vcc and a ground potential GND by cutting off fuse 32, so as to prevent a current from flowing through the fuse between the power supply potential Vcc and the ground potential GND.

Moreover, if there is some defective memory cell 51, current consumption occurs as conventional in a memory cell block (e.g., 30.1) including that defective memory cell 51 whereas it is possible to completely eliminate current consumption in memory cell blocks (e.g., 30.2–30.k) including no defective memory cell 51. Moreover, such an effect is achieved that current consumption decreases in inverse proportion to the number of memory cell blocks 30.1–30.k.

High resistance elements 43 and 47 shown in FIGS. 11 and 12 may be replaced by fuses. In this case, however, it is necessary to cut off all the fuses of either the bit line peripheral circuits or the column selecting gates of the memory cell block in which a defective memory cells 51 exists, resulting in a disadvantage that the number of fuses to be cut off increases.

Figure 13:
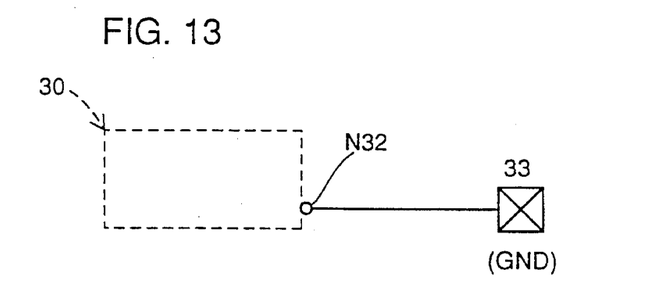
FIG. 13 is a circuit block diagram showing one example of improvements of the SRAM shown in FIG. 9.

As shown in FIG. 13, in the case where fuse 32 of FIG. 9 is removed, no defective memory cell 51 exists in memory cell array 50, and bit line pairs BL, /BL need not be set in a non-selection state, then bonding pad 33 does not have to be bonded to a ground pin.

According to the above improvement, if there is no defective memory cell 51 in memory cell array 50, it is totally unnecessary to cut off fuses or bond bonding pad 33. Accordingly, a decrease in production yield due to defective cutting off of fuse 32 does not occur in the SRAM shown in FIGS. 9–12.

In the above improvement, however, it is necessary to sort SRAMs which do not require bonding and those which require bonding prior to bonding of bonding pad 33. The SRAM shown in FIGS. 9–12 has an advantage that sorting is unnecessary since bonding pads 33 of all the SRAMs should be bonded.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in which data are electrically rewritable, comprising:

a memory cell array including a plurality of memory cells rows and columns, each specified by its own address formed by a plurality of address signals;

a redundancy memory cell row or column for substituting for defective memory cell row or column of said memory cell array;

a plurality of address signal input terminals, each provided corresponding to each of said plurality of address signals; and redundancy means responsive to input of the plurality of address signals specifying said defective memory cell row or column from said plurality of address signal input terminals for selecting said redundancy memory cell row or column instead of said defective memory cell row or column, wherein said redundancy means includes a plurality of gate means, each provided corresponding to each of said plurality of address signal input terminals for inhibiting passage of an address signal input from a corresponding address signal input terminal in response to application of a first potential to its control electrode and passing the address signal in response to application of a second potential to its control electrode, a first fuse provided corresponding to each of said gate means, connected between a first node receiving said first potential and a control electrode of the corresponding gate means, and cut off when an address signal input from the address signal input terminal for the corresponding gate means among the plurality of address signals specifying said defective memory cell row or column has a first logic, a second fuse provided corresponding to each of said gate means, connected between a second node receiving said second potential and the control electrode of the corresponding gate means, and cut off when an address signal input from the address signal input terminal for the corresponding gate means among the plurality of address signals specifying said defective memory cell row or column has a second logic, and selecting means for selecting said redundancy memory cell row or column in response to all the address signals passed through said plurality of gate means having the first logic.

2. The semiconductor memory device according to claim 1, wherein said redundancy means further includes a third fuse connected between a power supply terminal receiving said second potential and said second node and cut off when said memory cell array does not include said defective memory cell row or column, and said second node receives said second potential from said power supply terminal through said third fuse.

3. The semiconductor memory device according to claim 1, wherein said redundancy means further includes a pad connected to said second node, and connected to a power supply terminal receiving said second potential with a bonding wire when said memory cell array includes said defective memory cell row or column, and said second node receives said second potential from said power supply terminal through said bonding wire and said pad.

4. The semiconductor memory device in which data are electrically rewritable, comprising:

a memory cell array including a plurality of memory cells arranged in rows and columns, a word line provided corresponding to each row, and a bit line pair provided corresponding to each column;

data input/output means for data input/output between said memory cell array and the outside world;

a bit line load provided corresponding to each bit line pair for charging the corresponding bit line pair and including a first pair of transistors which have respective input electrodes connected to a line of a first potential and which are connected between the line of a first potential and respective one ends of the corresponding bit line pair;

a column selecting line provided corresponding to each bit line pair;

a column selecting gate provided corresponding to each bit line pair and including a second pair of transistors which have respective input electrodes connected to a corresponding column selecting line and are connected between respective other ends of the corresponding bit line pair and said data input/output means;

row selecting means for selecting any word line of said memory cell array in accordance with a row address signal and driving the selected word line to an activated level to activate corresponding memory cells;

column selecting means for selecting any bit line pair of said memory cell array in accordance with a column address signal and driving a column selecting line corresponding to the selected bit line pair to an activated level to render a corresponding column selecting gate conductive;

a redundancy bit line pair substituting for a defective bit line-pair of said memory cell array; and disabling means for disabling the defective bit line pair substituted by said redundancy bit line pair; wherein said disabling means includes a first fuse provided corresponding to each bit line load, cut off when the corresponding bit line pair is defective for rendering the corresponding bit line load non-conductive, a first resistance element provided corresponding to each bit line load and having one electrode connected to the input electrodes of said first transistor pair included in the corresponding bit line load;

a second fuse provided corresponding to each column selecting gate, cut off when the corresponding bit line pair is defective for rendering the corresponding column selecting gate non-conductive, a second resistance element provided corresponding to each column selecting gate and having one electrode connected to the input electrodes of said second transistor pair included in the corresponding column selecting gate, and a third fuse connected between respective other electrodes of said first and second resistance elements and a line of a second potential and cut off when said memory cell array does not include a defective bit line pair; and wherein the input electrodes of said first pair of transistors included in each bit line load are connected with said line of a first potential through said first fuse; and the input electrodes of said second pair of transistors included in each column selecting gate are connected with the corresponding column selecting line through said second fuse.

5. The semiconductor memory device in which data are electrically rewritable, comprising:

a memory cell array including a plurality of memory cells arranged in rows and columns, a word line provided corresponding to each row, and a bit line pair provided corresponding to each column;

data input/output means for data input/output between said memory cell array and the outside world;

a bit line load provided corresponding to each bit line pair for charging the corresponding bit line pair and including a first pair of transistors which have respective input electrodes connected to a line of a first potential and which are connected between the line of a first potential and respective one ends of the corresponding bit line pair;

a column selecting line provided corresponding to each bit line pair;

a column selecting gate provided corresponding to each bit line pair and including a second pair of transistors which have respective input electrodes connected to a corresponding column selecting line and are connected between respective other ends of the corresponding bit line pair and said data input/output means;

row selecting means for selecting any word line of said memory cell array in accordance with a row address signal for driving the selected word line to an activated level to activate corresponding memory cells;

column selecting means for selecting any bit line pair of said memory cell array in accordance with a column address signal for driving a column selecting line corresponding to the selected bit line pair to an activated level to render a corresponding column selecting gate conductive;

a redundancy bit line pair for substituting for a defective bit line pair of said memory cell array; and disabling means for disabling the defective bit line pair substituted by said redundancy bit line pair; wherein said disabling means includes a first fuse provided corresponding to each bit line load, cut off when the corresponding bit line pair is defective to render the corresponding bit line load non-conductive, a first resistance element provided corresponding to each bit line load and having one electrode connected to the input electrodes of said first transistor pair included in the corresponding bit line a second fuse provided corresponding to each column selecting gate, cut off when the corresponding bit line pair is defective to render the corresponding column selecting gate non-conductive, a second resistance element provided corresponding to each column selecting gate and having one electrode connected to the input electrodes of said second transistor pair included in the corresponding column selecting gate, and a pad connected to respective other electrodes of said first and second resistance elements, and connected to a power supply terminal receiving a second potential with a bonding wire when said memory cell array includes a defective bit line pair, wherein the input electrodes of said first pair of transistors included in each bit line load are connected with said line of a first potential through said first fuse; and the input electrodes of said second pair of transistors included in each column selecting gate are connected with the corresponding column selecting line through said second fuse.

* * * * *